US012571835B2

(12) United States Patent
Lee et al.

(10) Patent No.: US 12,571,835 B2
(45) Date of Patent: Mar. 10, 2026

(54) METHOD OF INSPECTING TEMPERATURE CONTROLLING SYSTEM

(71) Applicant: SEMES CO., LTD.,
Chungcheongnam-do (KR)

(72) Inventors: Chungwoo Lee, Suwon-si (KR);
Yunsik Ju, Yongin-si (KR)

(73) Assignee: SEMES CO., LTD.,
Chungcheongnam-do (KR)

( * ) Notice: Subject to any disclaimer, the term of this patent is extended or adjusted under 35 U.S.C. 154(b) by 300 days.

(21) Appl. No.: 18/142,027

(22) Filed: May 2, 2023

(65) Prior Publication Data

US 2024/0003962 A1     Jan. 4, 2024

(30) Foreign Application Priority Data

Jul. 1, 2022     (KR) ........................ 10-2022-0081484

(51) Int. Cl.
*G01R 31/28* (2006.01)
*G01R 23/02* (2006.01)
*G05B 23/02* (2006.01)

(52) U.S. Cl.
CPC ....... *G01R 31/282* (2013.01); *G05B 23/0221* (2013.01)

(58) Field of Classification Search
None
See application file for complete search history.

(56) References Cited

U.S. PATENT DOCUMENTS 12,207,362 B2 * 1/2025 Lee ...................... H05B 1/0233
2021/0384053 A1   12/2021 Jing 2022/0167462 A1 * 5/2022 Lee ...................... H05B 1/0233
2023/0029721 A1 * 2/2023 Lee ...................... H01J 37/3244
2023/0038552 A1 * 2/2023 Schmidtlein ....... G01R 31/2849
2023/0044388 A1   2/2023 Lee

FOREIGN PATENT DOCUMENTS

KR     10-2021-0069119     6/2021
KR     10-2022-0009258     1/2022

OTHER PUBLICATIONS

Notice of Allowance dated Aug. 2, 2024 for Korean Patent Application No. 10-2022-0081484 and its English translation from Global Dossier.
Office Action dated May 27, 2024 for Korean Patent Application No. 10-2022-0081484 and its English translation from Global Dossier.

* cited by examiner

*Primary Examiner* — Jermele M Hollington
(74) *Attorney, Agent, or Firm* — WOMBLE BOND DICKINSON (US) LLP

(57)     ABSTRACT

A method of inspecting a temperature controlling system is provided. The method includes generating a measurement matrix based on current measurement values of the temperature controlling system, calculating a transformation matrix having the same dimensions as the measurement matrix based on the measurement matrix, calculating an auxiliary matrix having the same dimensions as the measurement matrix based on the transformation matrix, and calculating a defect matrix representing defective diodes among the plurality of diodes, based on a difference operation between the auxiliary matrix and the transformation matrix.

20 Claims, 12 Drawing Sheets

FIG. 1

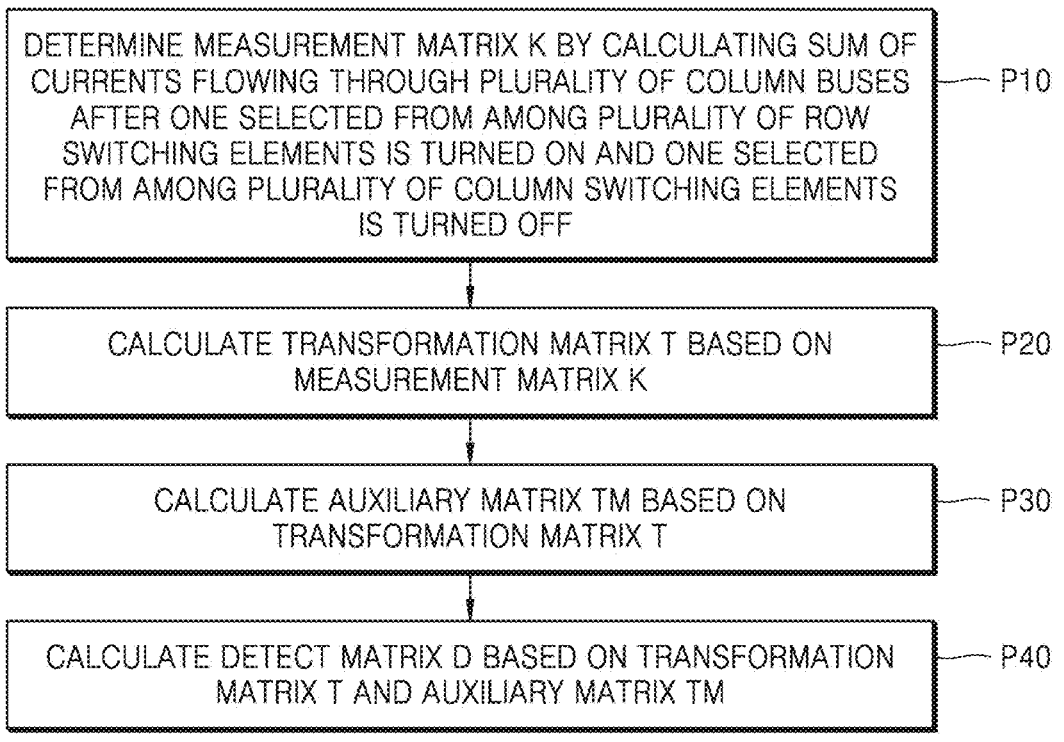

DETERMINE MEASUREMENT MATRIX K BY CALCULATING SUM OF CURRENTS FLOWING THROUGH PLURALITY OF COLUMN BUSES AFTER ONE SELECTED FROM AMONG PLURALITY OF ROW SWITCHING ELEMENTS IS TURNED ON AND ONE SELECTED FROM AMONG PLURALITY OF COLUMN SWITCHING ELEMENTS IS TURNED OFF ——— P10

CALCULATE TRANSFORMATION MATRIX T BASED ON MEASUREMENT MATRIX K ——— P20

CALCULATE AUXILIARY MATRIX TM BASED ON TRANSFORMATION MATRIX T ——— P30

CALCULATE DETECT MATRIX D BASED ON TRANSFORMATION MATRIX T AND AUXILIARY MATRIX TM ——— P40

FIG. 3

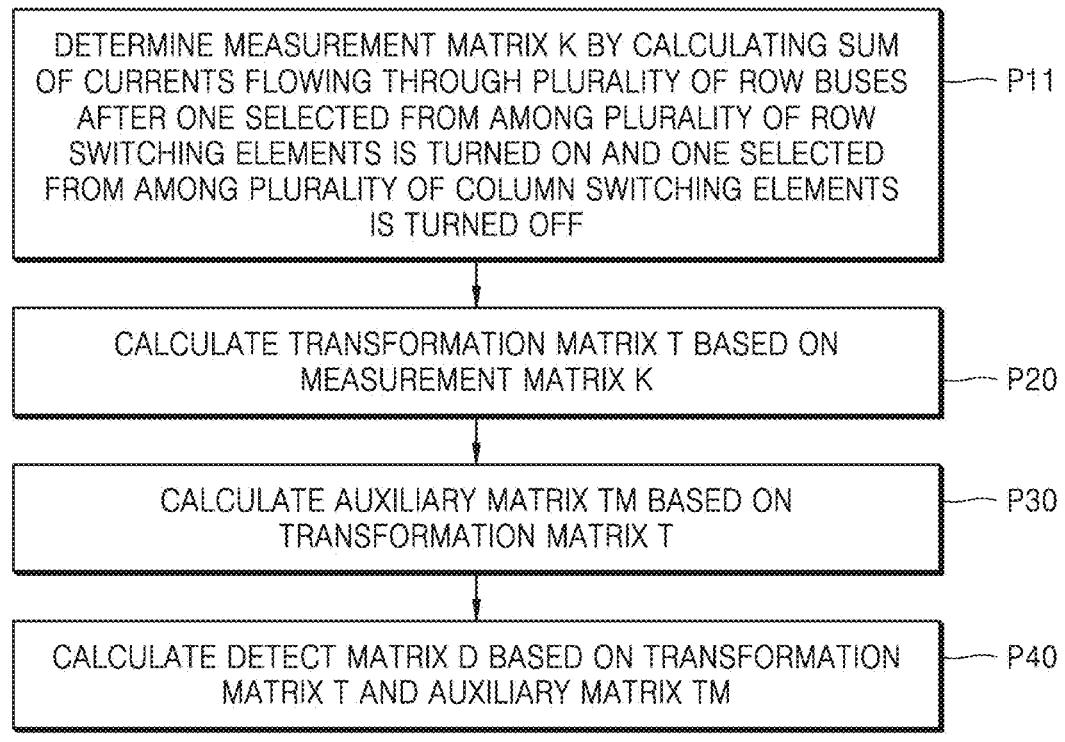

DETERMINE MEASUREMENT MATRIX K BY CALCULATING SUM OF CURRENTS FLOWING THROUGH PLURALITY OF ROW BUSES AFTER ONE SELECTED FROM AMONG PLURALITY OF ROW SWITCHING ELEMENTS IS TURNED ON AND ONE SELECTED FROM AMONG PLURALITY OF COLUMN SWITCHING ELEMENTS IS TURNED OFF — P11

CALCULATE TRANSFORMATION MATRIX T BASED ON MEASUREMENT MATRIX K — P20

CALCULATE AUXILIARY MATRIX TM BASED ON TRANSFORMATION MATRIX T — P30

CALCULATE DETECT MATRIX D BASED ON TRANSFORMATION MATRIX T AND AUXILIARY MATRIX TM — P40

METHOD OF INSPECTING TEMPERATURE CONTROLLING SYSTEM

CROSS-REFERENCE TO RELATED APPLICATION

This application is based on and claims priority under 35 U.S.C. § 119 to Korean Patent Application No. 10-2022-0081484, filed on Jul. 1, 2022, in the Korean Intellectual Property Office, the disclosure of which is incorporated by reference herein in its entirety.

BACKGROUND

1. Field

The technical idea of the present disclosure relates to a method of inspecting a temperature controlling system, and more particularly, to a method of inspecting a temperature controlling system including a plurality of heaters arranged in a matrix.

2. Description of the Related Art

A process of fabricating semiconductor devices is performed under highly controlled parameters (for example, temperature, atmospheric pressure, and atmosphere). Accordingly, a process chamber in which the process of fabricating semiconductor devices is performed includes various elements for adjusting the parameters.

One element for adjusting the parameter is a temperature controlling system in which a plurality of heaters and a plurality of diodes are arranged in a matrix. Defects of the plurality of diodes cause unwanted operations of the heaters, which reduces operational reliability of the temperature controlling system.

Accordingly, there is a need for a method of identifying defects occurring in a plurality of diodes included in a temperature controlling system and the defective diodes.

SUMMARY

The present disclosure provides a method of inspecting a temperature controlling system by identifying defects occurring in a plurality of diodes included in the temperature controlling system and the defective diodes.

Additional aspects will be set forth in part in the description which follows and, in part, will be apparent from the description, or may be learned by practice of the presented embodiments of the disclosure.

According to an aspect of the present disclosure, a method of inspecting a temperature controlling system including a plurality of heaters and a plurality of diodes arranged in a matrix, includes generating a measurement matrix based on current measurement values of the temperature controlling system, calculating a transformation matrix having the same dimensions as the measurement matrix, based on the measurement matrix, calculating an auxiliary matrix having the same dimensions as the measurement matrix, based on the transformation matrix, and calculating a defect matrix representing defective diodes among the plurality of diodes, based on a difference operation between the auxiliary matrix and the transformation matrix, wherein each of components of the measurement matrix and each of components of the transformation matrix are dependent on the number of defective diodes connected to a diode corresponding to component of matrix among the plurality of diodes.

According to another aspect of the present disclosure, a method of inspecting a temperature controlling system including a plurality of row buses, a plurality of row switching elements respectively connected to the plurality of row buses, a plurality of column buses, a plurality of column switching elements respectively connected to the plurality of column buses, a plurality of heaters connected to the plurality of row buses, and a plurality of diodes respectively connected to the plurality of heaters and respectively connected to the plurality of column buses is provided. The method includes determining a measurement matrix by detecting currents output through the plurality of column buses after one row switching element selected from among the plurality of row switching elements is turned on and one column switching element selected from among the plurality of column switching elements is turned off, calculating a transformation matrix based on the measurement matrix, calculating an auxiliary matrix based on the transformation matrix, and calculating a defect matrix representing defective diodes among the plurality of diodes based on the auxiliary matrix and the transformation matrix, wherein the transformation matrix is determined according to an equation below, $$Tij = \alpha * \frac{Kij}{1 - Kij}$$

where $Tij$ is a (i,j) component of the transformation matrix, $Kij$ is a (i,j) component of the measurement matrix, and a is determined based on a number of the plurality of column buses and a number of the plurality of row buses.

According to another aspect of the present disclosure, a method of inspecting a temperature controlling system including a plurality of row buses, a plurality of row switching elements respectively connected to the plurality of row buses, a plurality of column buses, a plurality of column switching elements respectively connected to the plurality of column buses, a plurality of heaters connected to the plurality of row buses, and a plurality of diodes respectively connected to the plurality of heaters and respectively connected to the plurality of column buses is provided. The method includes calculating each of components of a transformation matrix which is the same as the number of defective diodes connected to a column bus to which a diode corresponding to each of the components of the transformation matrix among the plurality of diodes is connected among the plurality of column buses, calculating an auxiliary matrix based on the transformation matrix, and calculating a defect matrix representing defective diodes among the plurality of diodes, based on an operation between the auxiliary matrix and the transformation matrix, wherein each of components of the auxiliary matrix is the same as a greatest value among values of the components included in the same column of the transformation matrix.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 1 is a flowchart illustrating a method of inspecting a temperature controlling system, according to an example embodiment;

FIG. 3 is a flowchart illustrating a method of inspecting a temperature controlling system, according to an example embodiment;

DETAILED DESCRIPTION

Figure 2A:
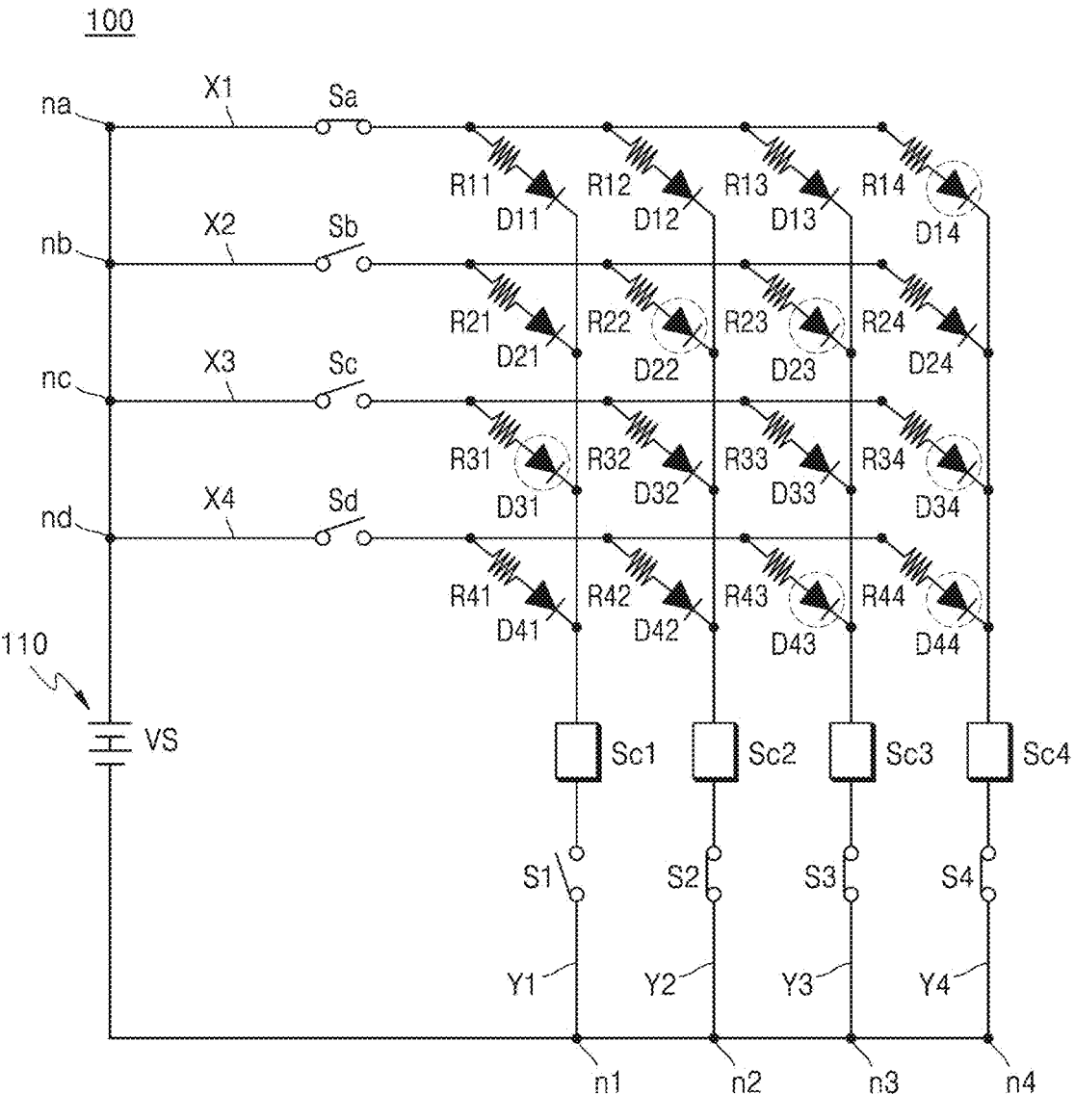
FIGS. 2A to 2D illustrate a temperature controlling system according to example embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described in detail with reference to the accompanying drawings. The same reference numerals are used for the same components in the drawings, and redundant descriptions thereof are omitted.

FIG. 1 is a flowchart illustrating a method of inspecting a temperature controlling system 100, according to an example embodiment. More specifically, FIG. 1 is a flowchart illustrating a method of detecting defects in the first to sixteenth diodes D11, D12, D13, D14, D21, D22, D23, D24, D31, D32, D33, D34, D41, D42, D43, D44 (hereinafter, D11 to D44) of a temperature controlling system 100.

FIGS. 2A-2D illustrate the temperature controlling system 100 according to example embodiments.

Figure 2B:
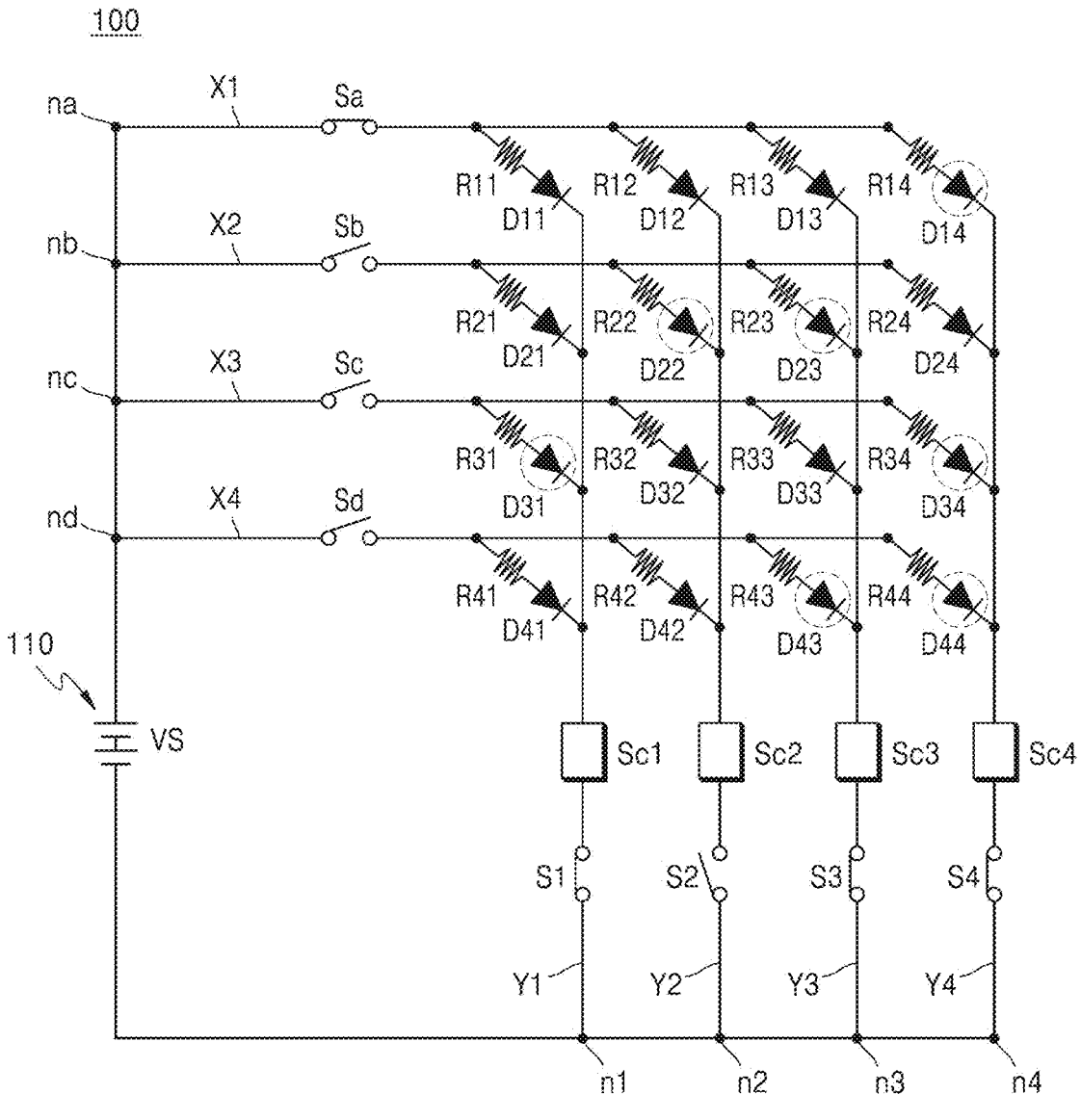
Figure 2C:
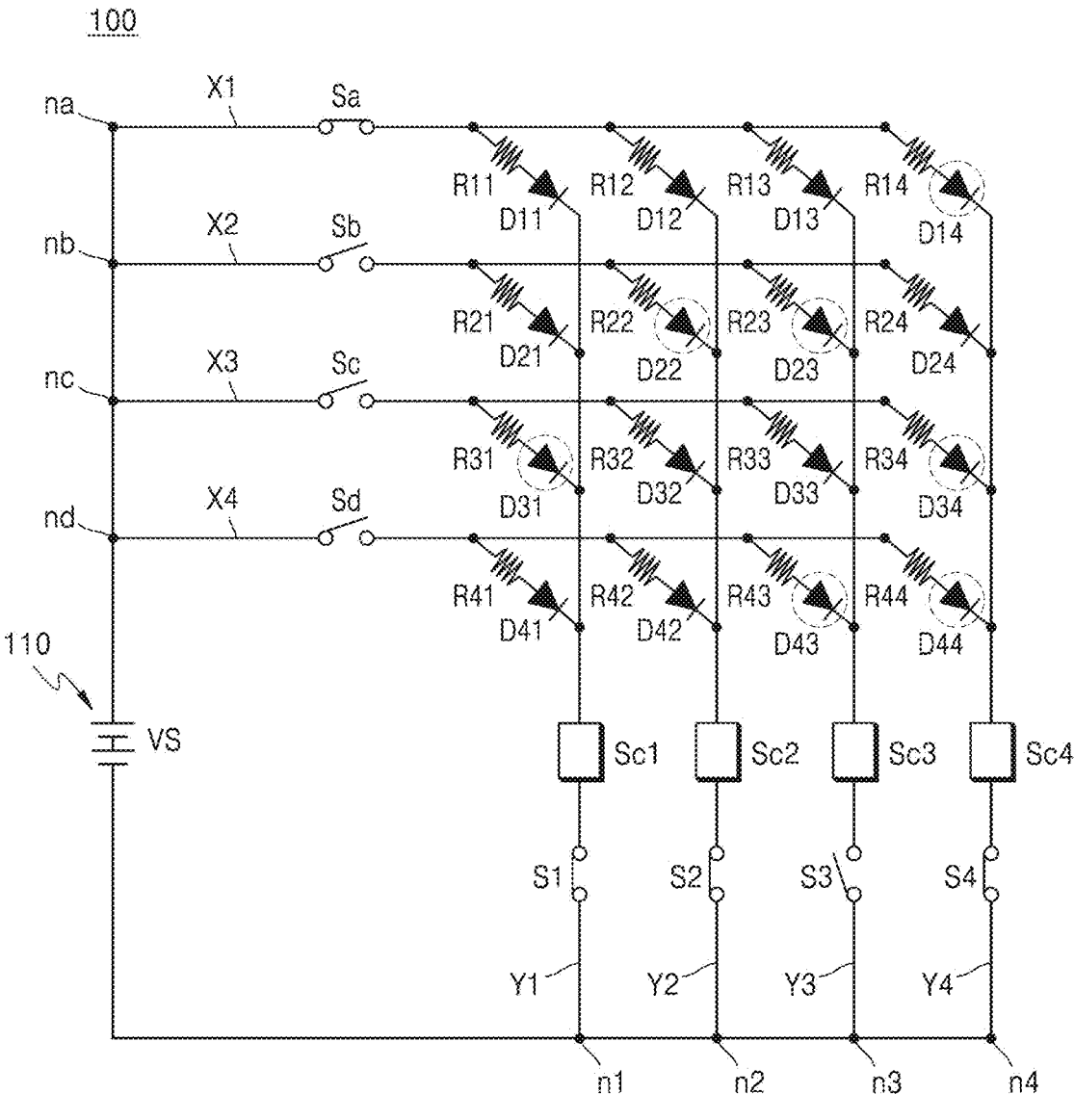
Figure 2D:
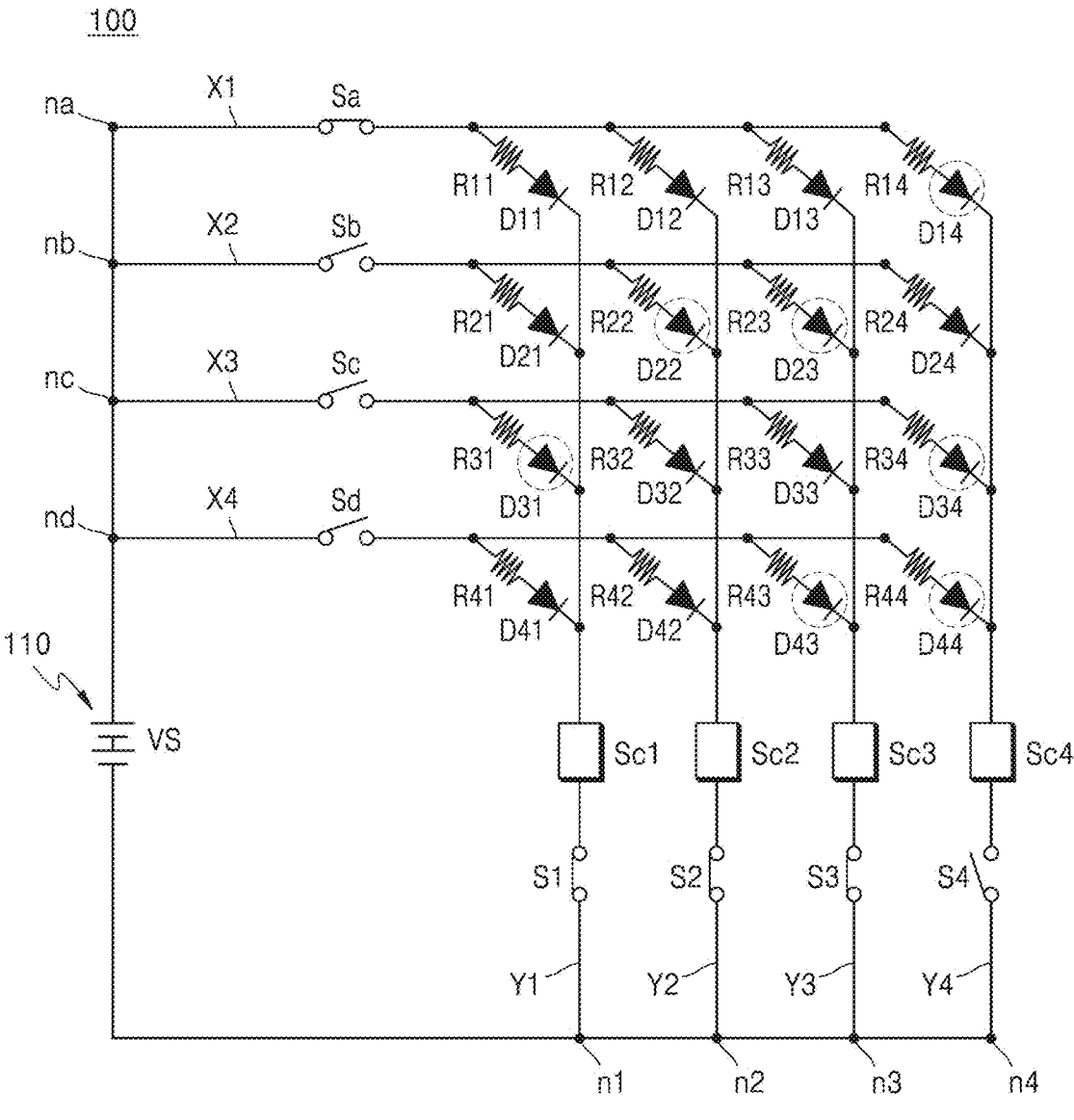

Referring to FIGS. 1 to 2D, the temperature controlling system 100 may include a power supply 110, first to fourth row buses X1, X2, X3, and X4, first to fourth row switching elements Sa, Sb, Sc, and Sd, first to sixteenth heaters R11, R12, R13, R14, R21, R22, R23, R24, R31, R32, R33, R34, R41, R42, R43, and R44 (hereinafter, R11 to R44), first to sixteenth diodes D11 to D44, first to fourth column buses Y1, Y2, Y3, and Y4, first to fourth ammeters Sc1, Sc2, Sc3, and Sc4, and first to fourth column switching elements S1, S2, S3, and S4.

The temperature controlling system 100 may control a temperature in a semiconductor device manufacturing facility, such as a plasma chamber. Dots in the schematic diagrams of FIGS. 2A to 2D represent junctions between electrical paths. Accordingly, simple crossings between electrical paths which are not marked with dots do not represent junctions.

The power supply 110 may include, for example, a voltage supply. The power supply 110 may maintain a potential difference between input nodes na, nb, nc, and nd of the first to fourth row buses X1, X2, X3, and X4 and output nodes n1, n2, n3, and n4 of the first to fourth column buses Y1, Y2, Y3, and Y4 as a supply voltage VS.

For example, a potential difference between each of the input nodes na, nb, nc, and nd and the output node n1 may be the supply voltage VS, a potential difference between each of the input nodes na, nb, nc, and nd and the output node n2 may be the supply voltage VS, a potential difference between each of the input nodes na, nb, nc, and nd and the output node n3 may be the supply voltage VS, and a potential difference between each of the input nodes na, nb, nc, and nd and the output node n4 may be the supply voltage VS.

The first to fourth row buses X1, X2, X3, and X4 and the first to fourth column buses Y1, Y2, Y3, and Y4 may provide paths for supplying the power generated by 110 to the first to sixteenth heaters R11 to R44. The input nodes n1, n2, n3, and n4 of the first to fourth row buses X1, X2, X3, and X4 may be connected to a first electrode (for example, a positive electrode) of the power supply 110. The output nodes n1, n2, n3, and n4 of the first to fourth column buses Y1, Y2, Y3, and Y4 may be connected to the second electrode (for example, a negative electrode) of the power supply 110. The first to fourth row buses X1, X2, X3, and X4 and the first to fourth column buses Y1, Y2, Y3, and Y4 may include conductors, such as wires.

The first row switching element Sa may be connected to the first row bus X1, the second row switching element Sb may be connected to the second row bus X2, the third row switching element Sc may be connected to the third row bus X3, and the fourth row switching element Sd may be connected to the fourth row bus X4.

The first row switching element Sa may allow or block power transmission through the first row bus X1, the second row switching element Sb may allow or block power transmission through the second row bus X2, the third row switching element Sc may allow or block power transmission through the third row bus X3, and the fourth row switching element Sd may allow or block power transmission through the third row bus X4.

The first heater R11 may be connected in series to the first diode D11. The second heater R12 may be connected in series to the second diode D12. The third heater R13 may be connected in series to the third diode D13. The fourth heater R14 may be connected in series to the fourth diode D14. The fifth heater R21 may be connected in series to the fifth diode D21. The sixth heater R22 may be connected in series to the sixth diode D22. The seventh heater R23 may be connected in series to the seventh diode D23. The eighth heater R24 may be connected in series to the eighth diode D24. The ninth heater R31 may be connected in series to the ninth diode D31. The tenth heater R32 may be connected in series to the tenth diode D32. The eleventh heater R33 may be connected in series to the eleventh diode D33. The twelfth heater R34 may be connected in series to the twelfth diode D34. The thirteenth heater R41 may be connected in series to the thirteenth diode D41. The fourteenth heater R42 may be connected in series to the fourteenth diode D42. The fifteenth heater R43 may be connected in series to the fifteenth diode D43. The sixteenth heater R44 may be connected in series to the sixteenth diode D44.

The first to sixteenth heaters R11 to R44 and the first to sixteenth diodes D11 to D44 may be arranged in a matrix. Accordingly, by selecting one of the first to fourth row buses X1, X2, X3, and X4 and selecting one of the first to fourth column buses Y1, Y2, Y3, and Y4, one of the first to sixteenth heaters R11 to R44 and one of the first to sixteenth diodes D11 to D44 may be accessed. For example, when the third row bus X3 and the second column bus Y2 are selected, the tenth heater R32 and the tenth diode D32 may be accessed.

First electrodes of the first to fourth heaters R11, R12, R13, and R14 may be connected to the first row bus X1. First electrodes of the fifth to eighth heaters R21, R22, R23, and R24 may be connected to the second row bus X2. First electrodes of the ninth to twelfth heaters R31, R32, R33, and R34 may be connected to the third row bus X3. First electrodes of the thirteenth to sixteenth heaters R41, R42, R43, and R44 may be connected to the fourth row bus X4.

An anode of the first diode D11 may be connected to a second electrode of the first heater R11, and a cathode of the first diode D11 may be connected to the first column bus Y1. An anode of the second diode D12 may be connected to a second electrode of the second heater R12, and a cathode of the second diode D12 may be connected to the second column bus Y2. An anode of the third diode D13 may be connected to a second electrode of the third heater R13, and a cathode of the third diode D13 may be connected to the third column bus Y3. An anode of the fourth diode D14 may be connected to a second electrode of the fourth heater R14, and a cathode of the fourth diode D14 may be connected to the fourth column bus Y1.

An anode of the fifth diode D21 may be connected to a second electrode of the fifth heater R21, and a cathode of the fifth diode D21 may be connected to the first column bus Y1. An anode of the sixth diode D22 may be connected to a second electrode of the sixth heater R22, and a cathode of the sixth diode D22 may be connected to the second column bus Y2. An anode of the seventh diode D23 may be connected to a second electrode of the seventh heater R23, and a cathode of the seventh diode D23 may be connected to the third column bus Y3. An anode of the eighth diode D24 may be connected to a second electrode of the eighth heater R24, and a cathode of the eighth diode D24 may be connected to the fourth column bus Y4.

An anode of the ninth diode D31 may be connected to a second electrode of the ninth heater R31, and a cathode of the ninth diode D31 may be connected to the first column bus Y1. An anode of the tenth diode D32 may be connected to a second electrode of the tenth heater R32, and a cathode of the tenth diode D32 may be connected to the second column bus Y2. An anode of the eleventh diode D33 may be connected to a second electrode of the eleventh heater R33, and a cathode of the eleventh diode D33 may be connected to the third column bus Y3. An anode of the twelfth diode D34 may be connected to a second electrode of the twelfth heater R34, and a cathode of the twelfth diode D34 may be connected to the fourth column bus Y4.

An anode of the thirteenth diode D41 may be connected to a second electrode of the thirteenth heater R41, and a cathode of the thirteenth diode D41 may be connected to the first column bus Y1. An anode of the fourteenth diode D42 may be connected to a second electrode of the fourteenth heater R42, and a cathode of the fourteenth diode D42 may be connected to the second column bus Y2. An anode of the fifteenth diode D43 may be connected to a second electrode of the fifteenth heater R43, and a cathode of the fifteenth diode D43 may be connected to the third column bus Y3. An anode of the sixteenth diode D44 may be connected to a second electrode of the sixteenth heater R44, and a cathode of the sixteenth diode D44 may be connected to the fourth column bus Y4.

Each of the first to sixteenth heaters R11 to R44 may generate heat based on the supply voltage VS. Each of the first to sixteenth diodes D11 to D44 may limit a direction of current passing through the first to sixteenth heaters R11 to R44 in a normal state. The first to sixteenth diodes D11 to D44 may each allow a current to flow from each anode to each cathode, but may block a current to flow from each cathode to each anode. The first to sixteenth diodes D11 to D44 may respectively allow currents to flow from the first to fourth input nodes na, nb, nc, and nd of the first to fourth row buses X1, X2, X3, and X4 to the output nodes n1, n2, n3, and n4 of the first to fourth column buses Y1, Y2, Y3, and Y4 through the 16 diodes D11 to D44. The first to sixteenth diodes D11 to D44 may respectively block currents from flowing from the first to fourth input nodes na, nb, nc, and nd of the first to fourth row buses X1, X2, X3, and X4 to the output nodes n1, n2, n3, and n4 of the first to fourth column buses Y1, Y2, Y3, and Y4 through the 16 diodes D11 to D44.

The first column switching element S1 may be connected to the first column bus Y1, the second column switching element S2 may be connected to the second column bus Y2, the third column switching element S3 may be connected to the third column bus Y3, and the fourth column switching element S4 may be connected to the fourth column bus Y4.

The first column switching element S1 may allow or block power transmission through the first column bus Y1, the second column switching element S2 may allow or block power transmission through the second column bus Y2, the third column switching element S3 may allow or block power transmission through the third column bus Y3, and the fourth column switching element S4 may allow or block power transmission through the fourth column bus Y4.

For example, the first to fourth row switching elements Sa, Sb, Sc, and Sd and the first to fourth column switching elements S1, S2, S3, and S4 may each include a relay. In another example, the first to fourth row switching elements Sa, Sb, Sc, and Sd and the first to fourth column switching elements S1, S2, S3, and S4 may each include one or more coupled transistors.

The first ammeter Sc1 may detect a current output through the first column bus Y1, the second ammeter Sc2 may detect a current output through the second column bus Y2, the third ammeter Sc3 may detect a current output through the third column bus Y3, and the fourth ammeter Sc4 may detect a current output through the fourth column bus Y4.

Hereinafter, a method of inspecting the temperature control system 100 (that is, a method of identifying faulty diodes among the first to sixteenth diodes D11 to D44) will be described in detail with reference to an example in which the fourth, sixth, seventh, ninth, twelfth, fifteenth, and sixteenth diodes D14, D22, D23, D31, D34, D43, and D44 are defective.

The defective fourth, sixth, seventh, ninth, twelfth, fifteenth, and sixteenth diodes D14, D22, D23, D31, D34, D43, and D44 may allow reverse currents. In FIGS. 2A to 2D, the fourth, sixth, seventh, ninth, twelfth, fifteenth, and sixteenth diodes D14, D22, D23, D31, D34, D43, and D44, which are defective, are circled with dashed lines (indicated by dashed circles).

Referring to FIG. 1 and FIGS. 2A to 2D, in P10, one row switching element selected from among a plurality of row switching elements (for example, the first to fourth row switching elements Sa, Sb, Sc, and Sd) is turned on and the other row switching elements among the plurality of row switching elements (for example, the first to fourth row switching elements Sa, Sb, Sc, and Sd) are turned off, and one column switching element selected from among a plurality of column switching elements (for example, the first to fourth column switching elements S1, S2, S3, and S4) is turned off and the other column switching elements among the plurality of column switching elements (for example, the first to fourth column switching elements S1, S2, S3, and S4) are turned off, and then, currents output through the first to fourth column buses Y1, Y2, Y3, and Y4 are detected by using the first to fourth ammeters Sc1, Sc2, Sc3, and Sc4, and accordingly, a measurement matrix K is determined.

In this case, when an ordinal number of the row switching element (that is, the turned-on row switching element) selected from among the first to fourth row switching elements Sa, Sb, Sc, and Sd is defined as i and an ordinal number of the column switching element (that is, the turned-on column switching element) selected from among the first to fourth column switching elements Sa, Sb, Sc, and Sd is defined as j, the measurement matrix K may be generated from values measured by the first to fourth ammeters Sc1, Sc2, Sc3, and Sc4 as represented by Equation 1 below.

$$K = [k_{ij}] = \frac{I1 + I2 + I3 + I4}{\left(\frac{|VS|}{R}\right)} - 3 \qquad \text{Equation 1}$$

Here, Kij is a component of an i row and a j column of the measurement matrix K and is determined by I1, I2, I3, and I4. I1 is a measured value (readings) of the first ammeter Sc1, I2 is a measured value of the second ammeter Sc2, I3 is a measured value of the third ammeter Sc3, I4 is a measured value of the fourth ammeter Sc4, |VS| is a magnitude of the supply voltage VS, and R is a resistance value of each of the first to sixteenth heaters R11 to R44. As described below, 3 is determined according to a size of a matrix and has a value obtained subtracting 1 from the number of rows and columns of the matrix.

For example, as illustrated in FIG. 2A, when the first row switching element Sa is turned on and the second to fourth row switching elements Sb, Sc, and Sd are turned off and the first column switching element S1 is turned off and the second to fourth column switching elements S2, S3, and S4 are turned on, $K_{11}$ may be determined by detecting currents flowing through the first to fourth column buses Y1, Y2, Y3, and Y4 by using the first to fourth ammeters Sc1, Sc2, Sc3, and Sc4.

In this case, because the first column switching element S1 is turned off, a value of I1 is 0. When all of the first to sixteenth diodes D11 to D44 are normal, a value of each of I2 to I4 is |VS|/R, and accordingly, a value of $K_{11}$ is 0. However, in this example, the fourth, sixth, seventh, ninth, twelfth, fifteenth, and sixteenth diodes D14, D22, D23, D31, D34, D43, and D44 are defective, and accordingly, the first diode (D11), a detour, which passes through the first diode D11 and passes through the ninth diode D31 in a reverse direction and passes through any one of the tenth to twelfth diodes D32, D33, and D34, may be formed.

Accordingly, the value of $K_{11}$ is as follows.

$$K11 = \frac{I1 + I2 + I3 + I4}{\left(\frac{|VS|}{R}\right)} - 3 = 3/7 \qquad \text{Equation 2}$$

In another example, as illustrated in FIG. 2B, when the first row switching element Sa is turned on and the second to fourth row switching elements Sb, Sc, and Sd are turned off and the second column switching element S2 is turned off and the first, third, and fourth column switching elements S1, S3, and S4 are turned on, $K_{12}$ may be determined by detecting values of currents flowing through the first to fourth column buses Y1, Y2, Y3, and Y4 by using the first to fourth ammeters Sc1, Sc2, Sc3, and Sc4.

In this case, because the second column switching element S2 is turned off, a value of I2 is 0. When all of the first to sixteenth diodes D11 to D44 are normal, a value of each of I1, I3, and I4 is |VS|/R, and accordingly, a value of $K_{12}$ is 0. However, in this example, the fourth, sixth, seventh, ninth, twelfth, fifteenth, and sixteenth diodes D14, D22, D23, D31, D34, D43, and D44 are defective, a detour, which passes through the second diode D12 and passes through the sixth diode D22 in a reverse direction and passes through any one of the fifth, seventh, and eighth diodes D21, D23, and D24, may be formed.

Accordingly, a value of $K_{12}$ is as follows.

$$K12 = \frac{I1 + I2 + I3 + I4}{\left(\frac{|VS|}{R}\right)} - 3 = 3/7 \qquad \text{Equation 3}$$

In another example, as illustrated in FIG. 2C, when the first row switching element Sa is turned on and the second to fourth row switching elements Sb, Sc, and Sd are turned off and the third column switching element S3 is turned off and the first, second, and fourth column switching elements S1, S2, and S4 are turned on, $K_{13}$ may be determined by detecting values of currents flowing through the first to fourth column buses Y1, Y2, Y3, and Y4 by using the first to fourth ammeters Sc1, Sc2, Sc3, and Sc4.

In this case, because the third column switching element S3 is turned off, a value of I3 is 0. When all of the first to sixteenth diodes D11 to D44 are normal, each value of I1, I2, and I4 is |VS|/R, and accordingly, a value of $K_{13}$ is 0. However, in this example, the fourth, sixth, seventh, ninth, twelfth, fifteenth, and sixteenth diodes D14, D22, D23, D31, D34, D43, and D44 are defective, a detour, which passes through the third diode D13 and passes through the seventh diode D23 in a reverse direction and passes through any one of the fifth, sixth, and eighth diodes D21, D22, and D24, may be formed, and a detour, which passes through the third diode D13 and passes through the fifteenth diode D43 in a reverse direction and passes through any one of the thirteenth, fourteenth, and sixteenth diodes D41, D42, and D44, may be formed.

Accordingly, the value of $K_{13}$ is as follows.

$$K13 = \frac{I1 + I2 + I3 + I4}{\left(\frac{|VS|}{R}\right)} - 3 = 3/5 \qquad \text{Equation 4}$$

In another example, as illustrated in FIG. 2D, when the first row switching element Sa is turned on and the second to fourth row switching elements Sb, Sc, and Sd are turned off and the fourth column switching element S4 is turned off and the first to third column switching elements S1, S2, and S3 are turned on, $K_{14}$ may be determined by detecting values of currents flowing through the first to fourth column buses Y1, Y2, Y3, and Y4 by using the first to fourth ammeters Sc1, Sc2, Sc3, and Sc4.

In this case, because the fourth column switching element S4 is turned off, a value of I4 is 0. When all of the first to sixteenth diodes D11 to D44 are normal, each value of I1, I2, and I3 is |VS|/R, and accordingly, a value of $K_{14}$ is 0. However, in this example, the fourth, sixth, seventh, ninth, twelfth, fifteenth, and sixteenth diodes D14, D22, D23, D31, D34, D43, and D44 are defective, a detour, which passes through the fourth diode D14 and passes through the twelfth diode D34 in a reverse direction and passes through any one of the ninth, tenth, and eleventh diodes D31, D32, and D33, may be formed, and a detour, which passes through the fourth diode D14 and passes through the sixteenth diode D44 in a reverse direction and passes through any one of the thirteenth, fourteenth, and fifteenth diodes D41, D42, and D43, may be formed.

Accordingly, the value of $K_{14}$ is as follows.

$$K = \frac{I1 + I2 + I3 + I4}{\left(\frac{|VS|}{R}\right)} - 3 = 3/5 \qquad \text{Equation 5}$$

The remaining components of the measurement matrix K may be determined in a manner similar to the components described above.

More specifically, components of the second row of the measurement matrix K may be determined by calculating the sum of currents output through the first to fourth column buses Y1, Y2, Y3, and Y4 after the second row switching element Sb is turned on, the first, third, and fourth row switching elements Sa, Sc, and Sd are turned off, and the first to fourth column switching elements S1 to S4 are sequentially turned on.

In addition, components of the third row of the measurement matrix K may be determined by calculating the sum of currents output through the first to fourth column buses Y1, Y2, Y3, and Y4 after the third row switching element Sc is turned on, the first, second, and fourth row switching elements Sa, Sb, and Sd are turned off, and the first to fourth column switching elements S1 to S4 are sequentially turned on.

In addition, components of the fourth row of the measurement matrix K may be determined by calculating the sum of currents output through the first to fourth column buses Y1, Y2, Y3, and Y4 after the fourth row switching element Sd is turned on, the first to third row switching elements Sa, Sb, and Sc are turned off, and the first to fourth column switching elements S1 to S4 are sequentially turned on.

$$K = \begin{bmatrix} 3/7 & 3/7 & 3/5 & 3/5 \\ 3/7 & 0 & 3/7 & 9/13 \\ 0 & 3/7 & 3/5 & 3/5 \\ 3/7 & 3/7 & 3/7 & 3/5 \end{bmatrix} \qquad \text{Equation 6}$$

Subsequently, in P20, a transformation matrix T may be calculated based on the measurement matrix K. The transformation matrix T may have the same dimensions as the measurement matrix K. That is, the number of rows of the transformation matrix T may be the same as the number of rows of the measurement matrix K, and the number of columns of the transformation matrix T may be the same as the number of columns of the measurement matrix K. For example, when the measurement matrix K is a 4 by 4 matrix, the transformation matrix T may also be a 4 by 4 matrix.

Each component of the transformation matrix T may be obtained by applying the transformation of Equation 7 to each component of the measurement matrix K.

$$Tij = \alpha * \frac{Kij}{1 - Kij} \qquad \text{Equation 7}$$

Here, a conversion factor $\alpha$ may be determined according to a size of a matrix. More specifically, the conversion factor $\alpha$ may be determined according to the number of columns of the measurement matrix K. For example, when the matrix is an N by N matrix, $\alpha = N/(N-1)$, and in the present example, when the number of columns of the measurement matrix is N=4, $\alpha = 4/3$. When the transformation of Equation 7 is applied to Equation 6, a transformation matrix of Equation 8 below may be calculated.

$$T = \begin{bmatrix} 1 & 1 & 2 & 2 \\ 1 & 0 & 1 & 3 \\ 0 & 1 & 2 & 2 \\ 1 & 1 & 1 & 2 \end{bmatrix} \qquad \text{Equation 8}$$

Subsequently, in 30, an auxiliary matrix TM may be calculated based on the transformation matrix T. The auxiliary matrix TM may have the same dimensions as the transformation matrix T. That is, the number of rows of the transformation matrix T, and the number of columns of the auxiliary matrix TM may be the same as the number of rows of the transformation matrix T, and the number of columns of the auxiliary matrix TM may be the same as the number of columns of the transformation matrix T.

Accordingly, the auxiliary matrix TM may have the same dimensions as the measurement matrix K. That is, the number of rows of the auxiliary matrix TM may be the same as the number of rows of the measurement matrix K, and the number of columns of the auxiliary matrix TM may be the same as the number of columns of the measurement matrix K.

According to example embodiments, when the transformation matrix T is a 4 by 4 matrix, the auxiliary matrix TM may also be a 4 by 4 matrix. Each component of the auxiliary matrix TM may be the greatest value among values of respective columns of the transformation matrix T.

For example, each value of components included in the first column of the auxiliary matrix TM may be 1, which is the greatest value among the components of the first column of the transformation matrix T. In addition, each value of the components included in the second column of the auxiliary matrix TM may be 1, which is the greatest value among values of the components of the second column of the transformation matrix T. In addition, each value of components included in the third column of the auxiliary matrix TM may be 2, which is the greatest value among values of the components of the third column of the transformation matrix T. In addition, each value of components included in the fourth column of the auxiliary matrix TM may be 3, which is the greatest value among the components of the fourth column of the transformation matrix T. Accordingly, the auxiliary matrix TM may be determined as represented by Equation 9.

$$TM = \begin{bmatrix} 1 & 1 & 2 & 3 \\ 1 & 1 & 2 & 3 \\ 1 & 1 & 2 & 3 \\ 1 & 1 & 2 & 3 \end{bmatrix} \qquad \text{Equation 9}$$

Unlike the above example, when each value of the components included in a certain column of the transformation matrix T is 3/13, all diodes in the certain column are out of order, and accordingly, values of all components included in the corresponding column of TM are determined as 16/13.

Subsequently, in 40, a detect matrix D may be calculated based on the auxiliary matrix TM and the transformation matrix T. According to example embodiments, as represented by Equation 10 below, a detect matrix D indicating defective diodes among the first to sixteenth diodes D11 to D44 may be determined by performing an operation (for example, a difference operation) on the auxiliary matrix TM and the transformation matrix T.

$$D = TM - T = \begin{bmatrix} 0 & 0 & 0 & 1 \\ 0 & 1 & 1 & 0 \\ 1 & 0 & 0 & 1 \\ 0 & 0 & 1 & 1 \end{bmatrix} \qquad \text{Equation 10}$$

Non-zero components of Equation 10 coincide with the fourth, sixth, seventh, ninth, twelfth, fifteenth, and sixteenth diodes D14, D22, D23, D31, D34, D43, and D44 which are defective.

In the transformation matrix T, when there are defective diodes among the diodes D11 to D44 corresponding to a certain component, defect of the corresponding component is reflected in other components included in the same column as the certain component.

More specifically, (1,1), (2,1), (3,1), and (4,1) components included in the first column of the measurement matrix K and the transformation matrix T are determined based on a measured value when the first column switching element S1 is turned off. The defective diode included in the first column is the ninth diode D31. When the first column switching element S1 is turned off, the defective ninth diode D31 provides a detour passing through the tenth to twelfth diodes D32, D33, and D34, and accordingly, each value of (1,1), (2,1), and (4,1) components of the transformation matrix T is 1. In addition, in determining the (3,1) component of the transformation matrix T, the first, fifth, and thirteenth diodes D11, D21, and D41 do not provide a detour, and accordingly, a value of the (3,1) component of the transformation matrix T is 0.

Based on a measured value when the second column switching element S2 is turned off, (1,2), (2,2), (3,2), and (4,2) components included in the second column of the measurement matrix K and the transformation matrix T are determined. A defective diode included in the second column is the sixth diode D22. When the second column switching element S2 is turned off, the sixth diode D22 provides a detour passing through the fifth, seventh, and eighth diodes D21, D23, and D24, and accordingly, each value of the (1,2), (3,2) and (4,2) components of the transformation matrix T is 1. In addition, in determining the (2,2) component of the transformation matrix T, the second, tenth and fourteenth diodes D12, D32, and D42 do not provide a detour, and accordingly, a value of the (2,2) component of the transformation matrix T is 0.

Based on a measured value when the third column switching element S3 is turned off, (1,3), (2,3), (3,3), and (4,3) components included in the third column of the measurement matrix K and the transformation matrix T are determined. Defective diodes included in the third column are the seventh and fifteenth diodes D23 and D43. When the third column switching element S3 is turned off, the seventh diode D23 provides a detour passing through the fifth, sixth, and eighth diodes D21, D22, and D24, and accordingly, the fifteenth diode D43 provides a detour passing through the thirteenth, fourteenth, and sixteenth diodes D41, D42, and D44. Therefore, the (1,3) and (3,3) components of the transformation matrix T are affected by the detour including the seventh diode D23 and the detour including the fifteenth diode D43, and accordingly, each value of the (1,3) and (3,3) components of the transformation matrix T is 2. In addition, the (2,3) component of the transformation matrix T is affected only by a first detour including the fifteenth diode D43, and the (4,3) component of the transformation matrix T is affected only by a second detour including the seventh diode D23. Accordingly, each value of the (2,3) and (4,3) components of the transformation matrix T is 1.

Based on a measured value when the fourth column switching element S4 is turned off, (1,4), (2,4), (3,4), and (4,4) components included in the fourth column of the measurement matrix K and the transformation matrix T are determined. Defective diodes included in the fourth column are the fourth, twelfth, and sixteenth diodes D14, D34, and D44. When the fourth column switching element S4 is turned off, the fourth diode D14 provides a detour passing through the first, second, and third diodes D11, D12, and the twelfth diode D34 provides a detour passing through the ninth, tenth, and eleventh diodes D31, D32, and D33, and the sixteenth diode D44 provides a detour passing through the thirteenth, fourteenth, and fifteenth diodes D41, D42, and D43.

Accordingly, the (1,4) component of the transformation matrix T is affected by a detour passing through any one of the twelfth and sixteenth diodes D34 and D44 in a reverse direction, the (2,4) component of the transformation matrix T is affected by a detour passing through any one of the fourth, twelfth, and sixteenth diodes D14, D34, and D44 in a reverse direction, the (3,4) component of the transformation matrix T is affected by a detour passing through one of the fourth and sixteenth diodes D14 and D44 in a reverse direction, and the (4,4) component of the transformation matrix T is affected by a detour passing through one of the fourth and twelfth diodes D14 and D34 in a reverse direction. Accordingly, each value of the (1,4), (3,4), and (4,4) components of the transformation matrix T is 2, and a value of the (2,4) component of the transformation matrix T is 3.

Here, components of the transformation matrix T corresponding to normal diodes (that is, the first, second, third, fifth, eighth, tenth, eleventh, thirteenth, and fourteenth diodes D11, D12, D13, D21, D24, D32, D33, D41, and D42) are defined as normal components, and components of the transformation matrix T corresponding to defective diodes (that is, the fourth, sixth, seventh, ninth, twelfth, fifteenth, and sixteenth diodes D14, D22, D23, D31, D34, D43, and D44) are defined as defective components.

In this case, values of the normal components of the transformation matrix T are the same as the number of defective diodes connected to the same column buses as the corresponding diodes. In addition, values of the defective components of the transformation matrix T are the same as a number obtained by subtracting 1 from the number of defective diodes connected to the same column buses as corresponding diodes.

An auxiliary matrix KM is determined as the greatest value of columns of the transformation matrix T, each component of the auxiliary matrix TM is the same as the number of defective diodes included in a corresponding column. Accordingly, in a difference operation TM-T between the transformation matrix T and the auxiliary matrix TM, a value of a component corresponding to the defective diode is 1, and a value of a component corresponding to the normal diode is 0.

In the inspection of the known temperature controlling system 100, defective diodes in the first to sixteenth diodes D11 to D44 are detected by turning on one of the first to fourth row switching elements Sa, Sb, Sc, and Sd and turning off one of the first to fourth column switching elements S1, S2, S3, and S4. However, in the inspection of the known temperature controlling system 100, defective diodes may be detected based on a change in current measurement value from a normal value, but position of the defective diodes in the first to sixteenth diodes D11 to D44 may not be detected.

In the method of inspecting the temperature controlling system 100 according to example embodiments, not only whether the first to sixteenth diodes D11 to D44 are defective may be determined, but also defective diodes in the first to sixteenth diodes D11 to D44 may be detected.

In forming resistance elements like actual chip resistors, there may be a difference between resistance values of the first to sixteenth heaters R11 to R44 designed to have the same resistance as each other despite strictness of a process. Accordingly, a matrix calculated by the same method as Equation 10 may include non-zero components corresponding to normal diodes.

However, tolerances of resistance values of the first to sixteenth heaters R11 to R44 are much less than resistance values of the first to sixteenth heaters R11 to R44, and accordingly, components of a detect matrix D of the normal diodes among the first to sixteenth diodes D11 to D44 may have a very small value. Accordingly, determination of the detect matrix D may include not only identifying components of a non-zero matrix but also determining the first to sixteenth diodes D11 to D44 corresponding to the components of the defect matrix D based on a set threshold as defective diodes. According to example embodiments, the determination of the detect matrix D may include determining that the first to sixteenth diodes D11 to D44 corresponding to components of the detect matrix D having a set threshold or greater are defective. For example, the threshold may be greater than or equal to about $1/10000$. In another example, the threshold may be greater than or equal to about $1/1000$. In another example, the threshold may be less than or equal to about $1/100$.

In the above description, for the sake of convenience of understanding, a method of determining defective diodes based on a 4 by 4 matrix is described, but an M by N matrix may also be determined in the same manner as described above. Here, M and N are integers greater than or equal to 2.

First, a generalized N by N measurement matrix GK is determined as represented by Equation 11 below based on values measured by the first to Nth ammeters.

$$GK = [GK_{ij}] = \begin{bmatrix} \text{sum of current measurement} \\ \text{values when } i\text{th row} \\ \text{switch is turned on} \\ \text{and } j\text{th column switch} \\ \underline{\text{is turned off}} \\ \dfrac{|VS|}{R} \end{bmatrix} - (N-1) \qquad \text{Equation 11}$$

Subsequently, a transformation matrix is calculated based on a transformation equation defined by Equation 12 below.

$$GTij = \alpha * \frac{GKij}{1 - GKij}, \text{ where } \alpha = \frac{N}{N-1} \qquad \text{Equation 12}$$

where N is the number of columns of the generalized measurement matrix GK.

Then, a generalized auxiliary matrix GTM defined as follows is calculated based on Equation 13.

$$GTM=[GTMij]=[max(GT1j,GT2j, \ldots ,GTAj)] \qquad \text{Equation 13}$$

where max is a function for calculating the greatest value of factors GT1j, GT2j, . . . , GTAj. Exceptionally, when values of components included in the j-th column are all N−1, that is, when GT1j=GT2j= . . . =GTAj=N−1, all diodes in the j-th column are defective, and accordingly, it is determined that GTMij=N.

Subsequently, as represented by Equation 14 below, a generalized defect matrix GD representing defective diodes may be calculated by an operation between the generalized transformation matrix GT and the generalized auxiliary matrix GTM.

$$GD=GTM-GT \qquad \text{Equation 14}$$

In the generalized defective matrix GD, diodes corresponding to components having a value of 0 are normal, and diodes corresponding to components having a value other than 0 are defective.

In another example, in the generalized defect matrix GD, diodes corresponding to components having values less than a threshold may be normal, and diodes corresponding to components having values greater than or equal to the threshold may be defective.

FIG. 3 is a flowchart illustrating a method of inspecting a temperature controlling system 101, according to an example embodiment.

Figure 4:
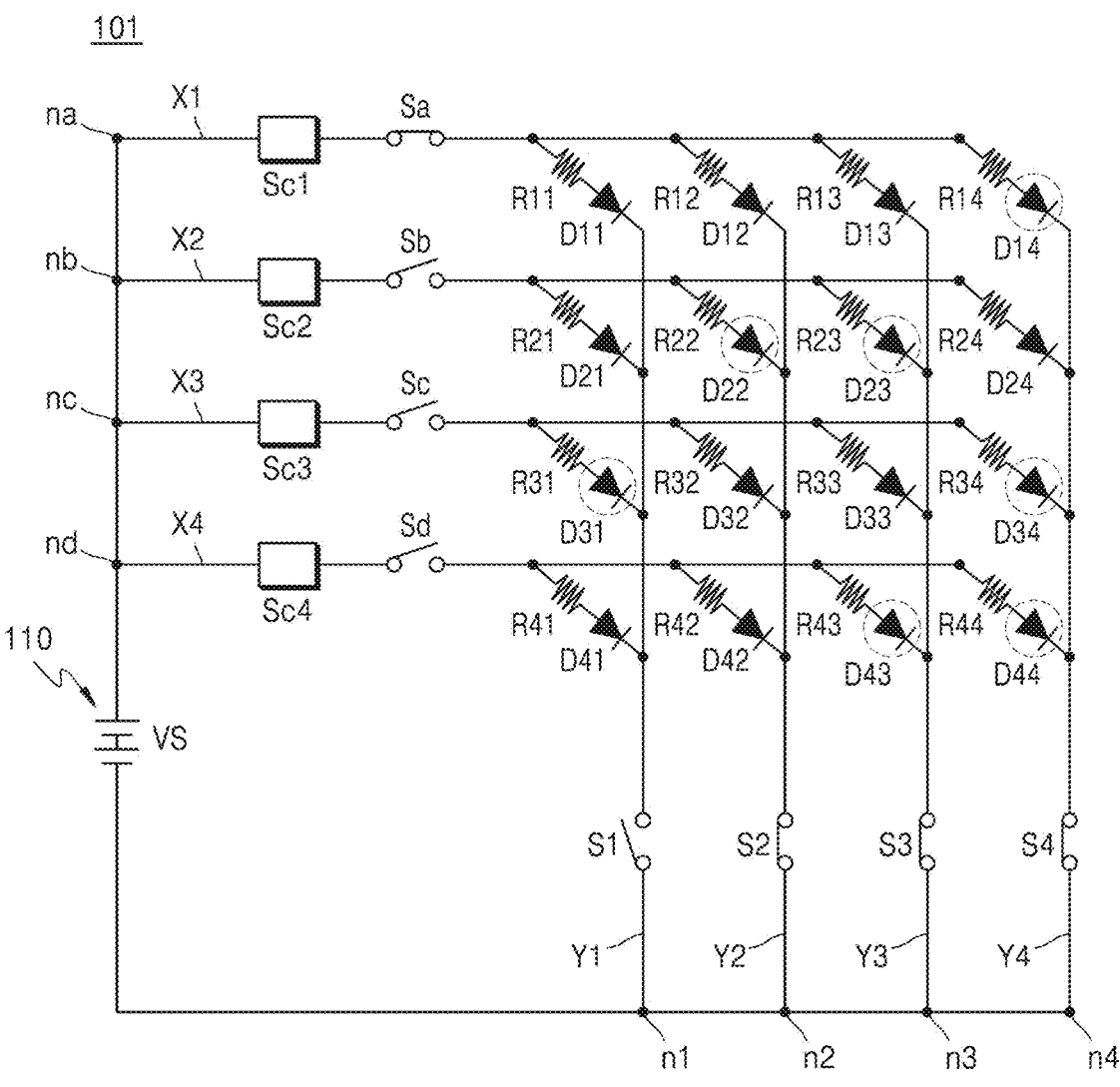
FIG. 4 illustrates a temperature controlling system according to an example embodiment.

FIG. 4 illustrates the temperature controlling system 101 according to an example embodiment.

Referring to FIGS. 3 and 4, the temperature controlling system 101 includes a power supply 110, first to fourth row buses X1, X2, X3, and X4, first to fourth row switching elements Sa, Sb, Sc, and Sd, first to sixteenth heaters R11, R12, R13, R14, R21, R22, R23, R24, R31, R32, R33, R34, R41, R42, R43, and R44 (hereinafter, R11 to R44), first to sixteenth diodes D11 to D44, first to fourth column buses Y1, Y2, Y3, and Y4, first to fourth ammeters Sc1, Sc2, Sc3, and Sc4, and first to fourth column switching elements S1, S2, S3, and S4.

According to an example embodiment, the temperature controlling system 101 is the same as the temperature controlling system 100 described with reference to FIGS. 2A to 2D, except that the first ammeter Sc1 is connected to the first row bus X1, the second ammeter Sc2 is connected to the second row bus X2, the third ammeter Sc3 is connected to the third row bus X3, and the fourth ammeter Sc4 is connected to the fourth row bus X4.

In the method of inspecting the temperature controlling system 101, P11 is the same as P10 except that the sum of currents flowing through the first to fourth row buses X1, X2, X3, and X4 is calculated by using the first to fourth ammeters Sc1, Sc2, Sc3, and Sc4.

P20 and P30 are substantially the same as the operations described with reference to FIGS. 1 to 2D.

Figure 5:
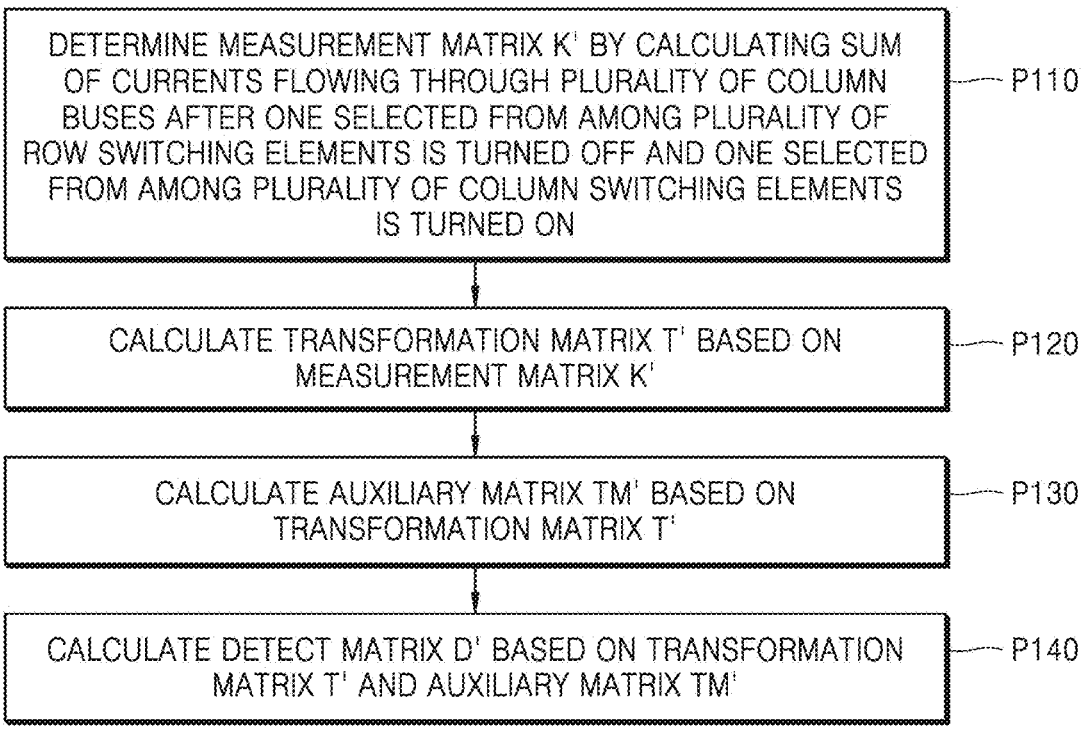
FIG. 5 is a flowchart illustrating a method of inspecting a temperature controlling system, according to another example embodiment.

FIG. 5 is a flowchart illustrating a method of inspecting a temperature controlling system 100, according to another example embodiment.

FIGS. 6A to 6D illustrate the temperature controlling system 100 according to example embodiments.

Referring to FIG. 5 and FIGS. 6A to 6D, in 110, one selected from among a plurality of row switching elements (for example, the first to fourth row switching elements Sa, Sb, Sc, and Sd) is turned off and the others of the plurality of row switching elements, for example, the first to fourth row switching elements Sa, Sb, Sc, and Sd are turned on, and one selected from among a plurality of column switching elements (for example, the first to fourth column switching elements S1, S2, S3, and S4) is turned on and the others of the plurality of column switching elements (for example, the first to fourth column switching elements S1, S2, S3, and S4) are turned off, and then, currents output through the first to fourth column buses Y1, Y2, Y3, and Y4 are detected by using the first to fourth ammeters Sc1, Sc2, Sc3, and Sc4, and accordingly, a measurement matrix K' may be determined.

Each component Kij' of the measurement matrix may be determined as represented by Equation 15 below.

$$K' = [K'_{ij}] = \frac{I1 + I2 + I3 + I4}{\left(\frac{|VS|}{R}\right)} - 3 \qquad \text{Equation 15}$$

Figure 6A:
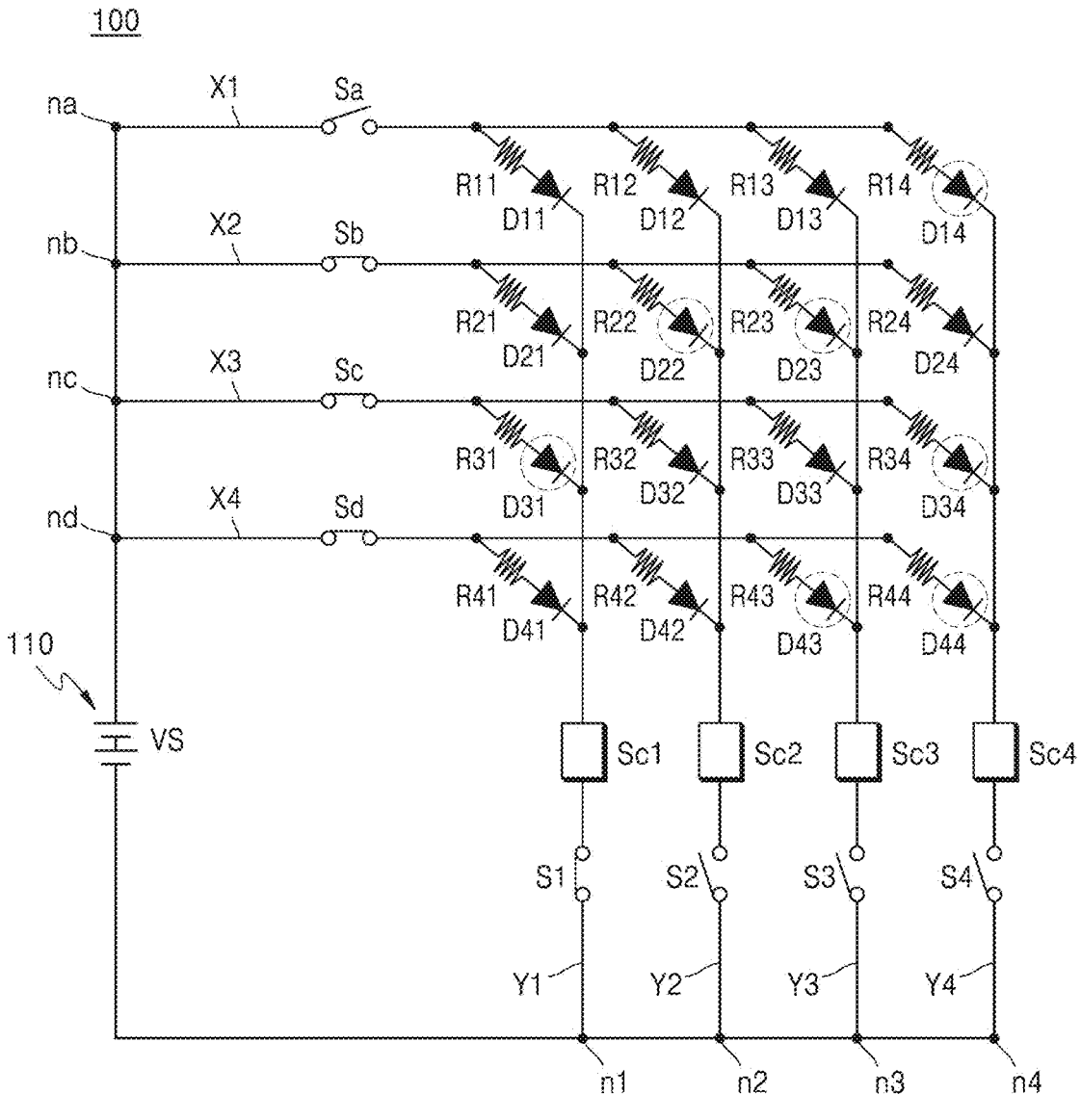
FIGS. 6A to 6D illustrate a temperature controlling system according to example embodiments.

For example, as illustrated in FIG. 6A, when the first row switching element Sa is turned off and the second to fourth row switching elements Sb, Sc, and Sd are turned on and the first column switching element S1 is turned on and the second to fourth column switching elements S2, S3, and S4 are turned off, $K_{11}'$ may be determined by detecting currents flowing through the first to fourth column buses Y1, Y2, Y3, and Y4 by using the first to fourth ammeters Sc1, Sc2, Sc3, and Sc4.

In this case, the second to fourth column switching elements S2, S3, and S4 are turned off, and accordingly, values of I2, I3, and I4 are zero. When all of the first to sixteenth diodes D11 to D44 are normal, a value of I1 is 3|VS|/R, and accordingly, a value of $K_{11}'$ is 0. However, in the present example, the fourth, sixth, seventh, ninth, twelfth, fifteenth, and sixteenth diodes D14, D22, D23, D31, D34, D43, and D44 are defective, and accordingly, a detour, which passes through any one of the eighth, twelfth, and sixteenth diodes D24, D34, and D44 and passes through the fourth diode D14 in a reverse direction and passes through the first diode D11, may be formed.

Accordingly, the value of $K_{11}'$ is represented by Equation 16 below.

$$K'_{11} = \frac{I1 + I2 + I3 + I4}{\left(\frac{|VS|}{R}\right)} - 3 = \frac{3}{7} \qquad \text{Equation 16}$$

Figure 6B:
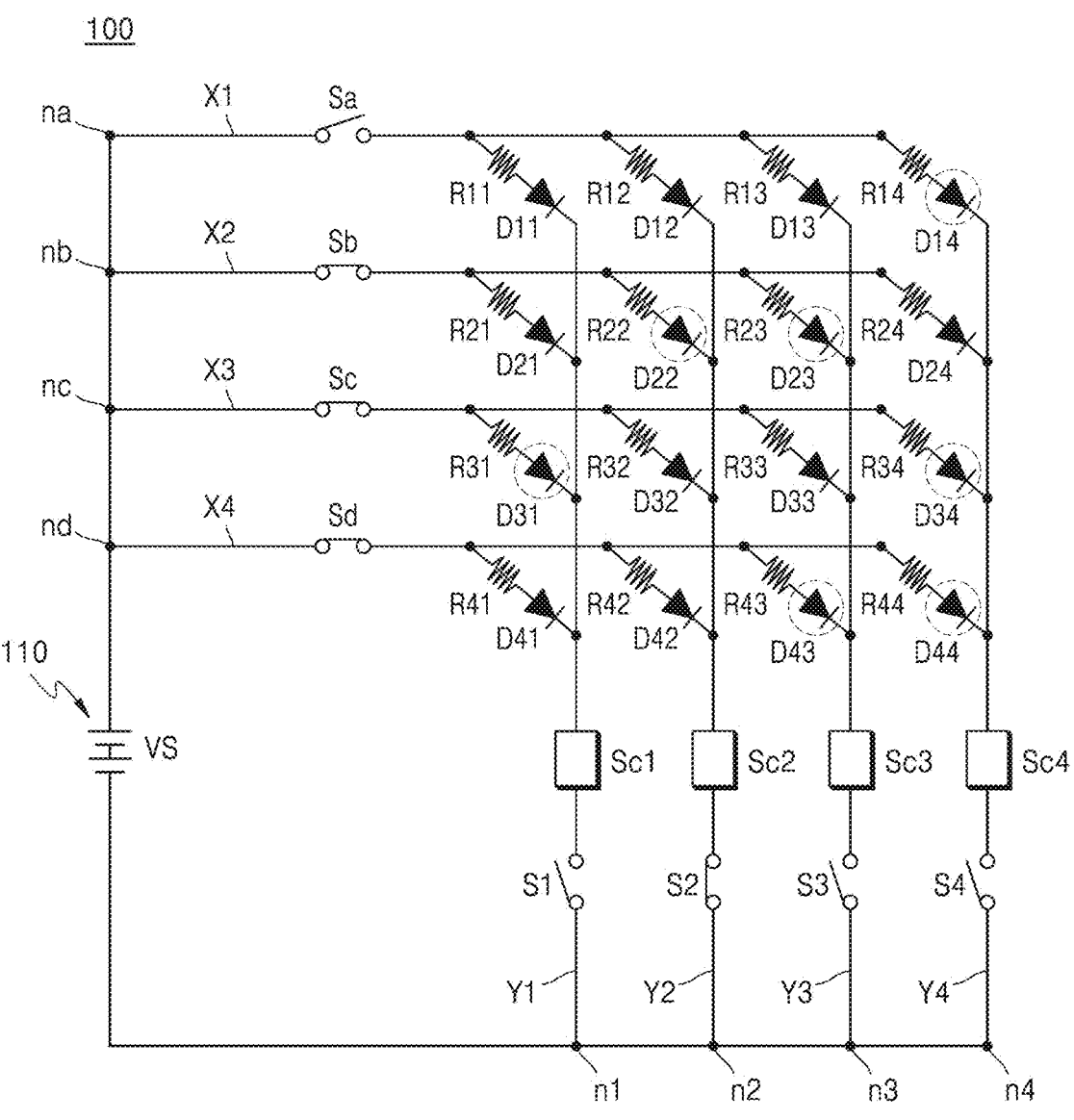

In another example, as illustrated in FIG. 6B, when the first row switching element Sa is turned off and the second to fourth row switching elements Sb, Sc, and Sd are turned on and the second column switching element S2 is turned on and the first, third, and fourth column switching elements S1, S3, and S4 are turned off, $K_{12}'$ may be determined by detecting values of currents flowing through the first to fourth column buses Y1, Y2, Y3, and Y4 by using the first to fourth ammeters Sc1, Sc2, Sc3, and Sc4.

In this case, because the first, third, and fourth column switching elements S1, S3, and S4 are turned off, values of I1, I3, and I4 are zero. When all of the first to sixteenth diodes D11 to D44 are normal, a value of I2 is 3|VS|/R, and accordingly, a value of $K_{12}'$ is 0. However, in the present example, the fourth, sixth, seventh, ninth, twelfth, fifteenth, and sixteenth diodes D14, D22, D23, D31, D34, D43, and D44 are defective, and accordingly, a detour, which passes through the fourth diode D14 in a reverse direction and passes through the second diode D12, may be formed.

Accordingly, the value of $K_{12}'$ is represented by Equation 17 below.

$$K'_{12} = \frac{I1 + I2 + I3 + I4}{\left(\frac{|VS|}{R}\right)} - 3 = 3/7 \qquad \text{Equation 17}$$

Figure 6C:
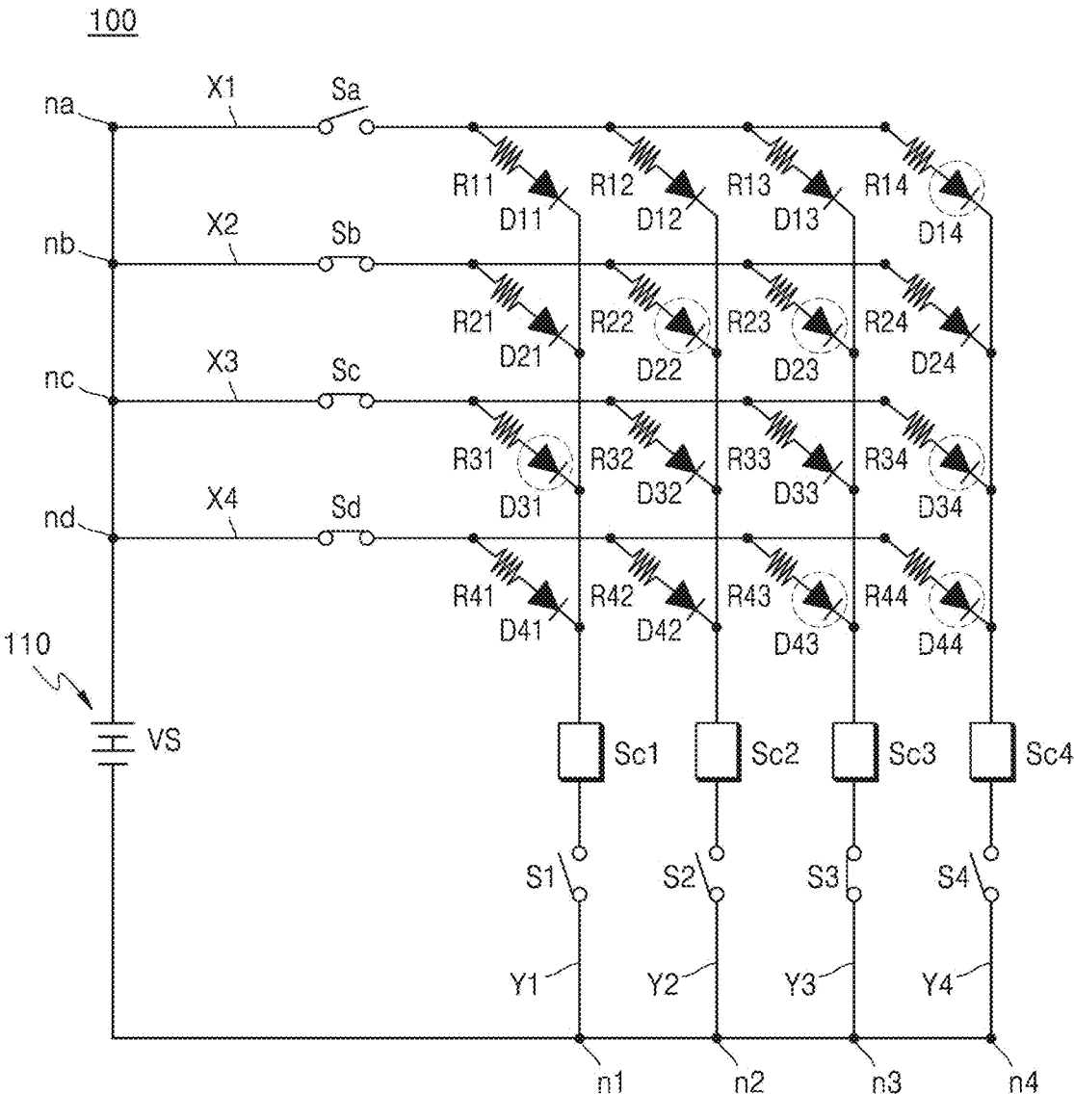

In another example, as illustrated in FIG. 6C, when the first row switching element Sa is turned off and the second to fourth row switching elements Sb, Sc, and Sd are turned on and the third column switching element S3 is turned on and the first, second, and fourth column switching elements S1, S2, and S4 are turned off, $K_{13}'$ may be determined by detecting values of currents flowing through the first to fourth column buses Y1, Y2, Y3, and Y4 by using the first to fourth ammeters Sc1, Sc2, Sc3, and Sc4.

In this case, because the first, second, and fourth column switching elements S1, S2, and S4 are turned off, values of I1, I2, and I4 are zero. When all of the first to sixteenth diodes D11 to D44 are normal, a value of I3 is 3|VS|/R, and accordingly, a value of $K_{13}'$ is 0. However, in the present example, the fourth, sixth, seventh, ninth, twelfth, fifteenth, and sixteenth diodes D14, D22, D23, D31, D34, D43, and D44 are defective, a detour, which passes through the fourth diode D14 in a reverse direction and passes through the third diode D13, may be formed.

Accordingly, the value of $K_{13}'$ is represented by Equation 18 below.

$$K'_{13} = \frac{I1 + I2 + I3 + I4}{\left(\frac{|VS|}{R}\right)} - 3 = 3/7 \qquad \text{Equation 18}$$

Figure 6D:
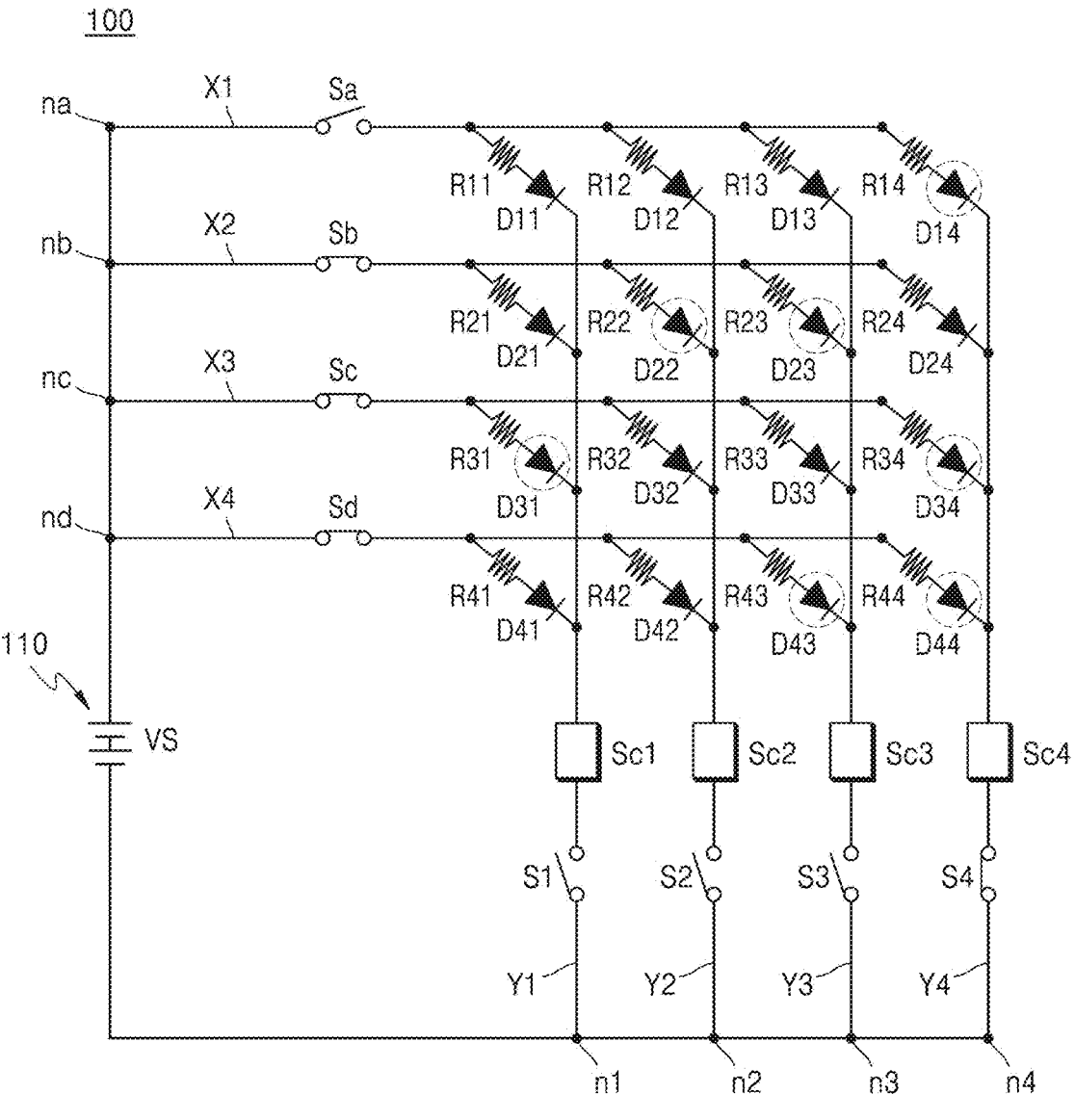

In another example, as illustrated in FIG. 6D, when the first row switching element Sa is turned off and the second to fourth row switching elements Sb, Sc, and Sd are turned on and the fourth column switching element S4 is turned on and the first to third column switching elements S1, S2, and S3 are turned off, $K_{14}'$ may be determined by detecting currents flowing through the first to fourth column buses Y1, Y2, Y3, and Y4 by using the first to fourth current ammeters Sc1, Sc2, Sc3, and Sc4.

In this case, because the first to third column switching elements S1, S2, and S3 are turned off, values of I1, I2, and I3 are 0. When all of the first to sixteenth diodes D11 to D44 are normal, each value of I1, I2, and I3 is |VS|/R, and accordingly, a value of $K_{14}'$ is 0. In the present example, the fourth, sixth, seventh, ninth, twelfth, fifteenth, and sixteenth diodes D14, D22, D23, D31, D34, D43, and D44 are defective, and accordingly, a detour is not formed in a switching state of FIG. 6D.

Accordingly, the value of $K_{14}'$ is represented by Equation 19 below.

$$K'_{14} = \frac{I1 + I2 + I3 + I4}{\left(\frac{|VS|}{R}\right)} - 3 = 0 \qquad \text{Equation 19}$$

The other components of the measurement matrix K' may be determined in the manner similar to the components described above. The measurement matrix K' is represented by Equation 20.

$$K' = \begin{bmatrix} 3/7 & 3/7 & 3/7 & 0 \\ 3/5 & 3/7 & 3/7 & 3/5 \\ 3/7 & 3/5 & 3/5 & 3/7 \\ 3/5 & 3/5 & 3/7 & 3/7 \end{bmatrix} \qquad \text{Equation 20}$$

Subsequently, in 120, a transformation matrix T' may be calculated based on the measurement matrix K'. The transformation matrix T' may have the same dimensions as the measurement matrix K'. That is, the number of rows of the transformation matrix T' may be the same as the number of rows of the measurement matrix K', and the number of columns of the transformation matrix T' may be the same as the number of columns of the measurement matrix K'. For example, when the measurement matrix K' is a 4 by 4 matrix, the transformation matrix T' may also be a 4 by 4 matrix.

Each component of the transformation matrix T' may be obtained by applying the transformation of Equation 21 to each component of the measurement matrix K'.

$$Tij' = \alpha * \frac{Kij'}{1 - Kij'} \qquad \text{Equation 21}$$

Here, a conversion factor $\alpha$ may be determined according to a size of a matrix. More specifically, the conversion factor $\alpha$ may be determined according to the number of rows of the matrix. For example, when the matrix is an N by N matrix, $\alpha = N/(N-1)$, and in the present example, when the number of rows is N=4, $\alpha = 4/3$. When the transformation of Equation 21 is applied to Equation 20, a transformation matrix of Equation 22 below may be calculated.

$$T' = \begin{bmatrix} 1 & 1 & 1 & 0 \\ 2 & 1 & 1 & 2 \\ 1 & 2 & 2 & 1 \\ 2 & 2 & 1 & 1 \end{bmatrix} \qquad \text{Equation 22}$$

Subsequently, in 130, an auxiliary matrix TM' may be calculated based on the transformation matrix T'.

The auxiliary matrix TM' may have the same dimensions as the transformation matrix T'. For example, when the transformation matrix T' is a 4 by 4 matrix, the auxiliary matrix TM' may also be a 4 by 4 matrix. Each component of the auxiliary matrix TM' may be the greatest value among values of respective rows of the transformation matrix T'.

For example, each value of the components included in the first row of the auxiliary matrix TM' may be 1, which is the greatest value among values of the components of the first row of the transformation matrix T'. For example, each value of the components included in the second row of the auxiliary matrix TM' may be 2, which is the greatest value among values of the components of the second row of the transformation matrix T'. For example, each value of the components included in the third row of the auxiliary matrix TM' may be 2, which is the greatest value among values of the components of the third row of the transformation matrix T'. For example, each value of the components included in the fourth row of the auxiliary matrix TM' may be 2, which is the greatest value among values of the components of the fourth row of the transformation matrix T'. Accordingly, the auxiliary matrix TM' may be determined as represented by Equation 24.

$$TM' = \begin{bmatrix} 1 & 1 & 1 & 1 \\ 2 & 2 & 2 & 2 \\ 2 & 2 & 2 & 2 \\ 2 & 2 & 2 & 2 \end{bmatrix} \qquad \text{Equation 24}$$

Unlike the example described above, when each value of components included in a certain row of the transformation matrix T' is 3 (that is, when each value is a value obtained by subtracting 1 from the number of rows), each value of all components included the corresponding row is determined as 4 because all diodes in the row are defective.

Subsequently, in 140, a defect matrix D' may be calculated based on the auxiliary matrix TM' and the transformation matrix T'. According to example embodiments, a defect matrix D' representing a defective diode among the first to sixteenth diodes D11 to D44 may be determined by performing an operation (for example, a difference operation) on the auxiliary matrix TM' and the transformation matrix T' as represented by Equation 25.

$$D = TM' - T' = \begin{bmatrix} 1 & 1 & 1 & 1 \\ 2 & 2 & 2 & 2 \\ 2 & 2 & 2 & 2 \\ 2 & 2 & 2 & 2 \end{bmatrix} - \begin{bmatrix} 1 & 1 & 1 & 0 \\ 2 & 1 & 1 & 2 \\ 1 & 2 & 2 & 1 \\ 2 & 2 & 1 & 1 \end{bmatrix} = \begin{bmatrix} 0 & 0 & 0 & 1 \\ 0 & 1 & 1 & 0 \\ 1 & 0 & 0 & 1 \\ 0 & 0 & 1 & 1 \end{bmatrix} \qquad \text{Equation 25}$$

As described above, for the sake of convenience of understanding, a method of determining defective diodes based on a 4 by 4 matrix is described, but an N by N matrix may also be determined in the same manner as described above.

First, a generalized measurement matrix GK' is determined based on the measured values of the first to Nth ammeters as represented by Equation 26 below.

$$GK' = [GK'_{ij}] = \begin{bmatrix} \dfrac{\text{sum of current measurement values when } ith \text{ row switch is turned off and } jth \text{ column switch is turned on}}{\dfrac{|VS|}{R}} - (N-1) \end{bmatrix} \qquad \text{Equation 26}$$

Subsequently, a generalized transformation matrix GT' is calculated based on a transformation equation defined by Equation 27 below.

$$GTij' = \alpha * \frac{GKij'}{1 - GKij'}, \text{ where } \alpha = \frac{N}{N-1} \qquad \text{Equation 27}$$

where N is the number of rows of the generalized transformation matrix GT'.

Subsequently, a generalized auxiliary matrix GTM' defined by Equation 28 below is calculated.

$$GTM' = [GTMij'] = [\max(GT1j', GT2j', \ldots, GTNj')] \qquad \text{Equation 28}$$

where max is a function for calculating the greatest value of factors $GT1j'$, $GT2j'$, . . . , $GTNj'$. Exceptionally, when values of components included in the j-th column are all N–1, that is, when $GT1j'=GT2j'=$ . . . $=GTAj'=N-1$, all diodes in the j-th column are defective, and accordingly, it is determined that $GTMij'=N$.

Subsequently, as represented by Equation 30 below, a generalized defect matrix GD' representing defective diodes may be calculated by an operation between the generalized transformation matrix GT' and the generalized auxiliary matrix GTM'.

$$GD'=GTM'-GT' \qquad \text{Equation 30}$$

In the generalized defective matrix GD', diodes corresponding to components having a value of 0 are normal, and diodes corresponding to components having a value other than 0 are defective.

In another example, in the generalized defect matrix GD', diodes corresponding to components having values less than a threshold may be normal, and diodes corresponding to components having values greater than or equal to the threshold may be defective.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method of inspecting a temperature controlling system including a plurality of heaters and a plurality of diodes arranged in a matrix, the method comprising:

generating a measurement matrix based on current measurement values of the temperature controlling system;

calculating a transformation matrix having the same dimensions as the measurement matrix, based on the measurement matrix;

calculating an auxiliary matrix having the same dimensions as the measurement matrix, based on the transformation matrix; and calculating a defect matrix representing defective diodes among the plurality of diodes, based on a difference operation between the auxiliary matrix and the transformation matrix, wherein each of components of the measurement matrix and each of components of the transformation matrix are dependent on the number of defective diodes connected to a diode corresponding to component of matrix among the plurality of diodes.

2. The method of claim 1, further comprising determining a plurality of diodes corresponding to components with a value of 1 among components of the defect matrix as the defective diodes.

3. The method of claim 1, further comprising determining a plurality of diodes corresponding to components with a value of 0 among components of the defect matrix as normal diodes.

4. The method of claim 1, further comprising determining a plurality of diodes corresponding to components with a value less than a threshold among components of the defect matrix as normal diodes, and determining a plurality of diodes corresponding to components with a value greater than or equal to the threshold among the components of the defect matrix as the defective diodes.

5. The method of claim 1, wherein the temperature controlling system further includes:

a plurality of row buses connected to a first electrode of each of the plurality of heaters;

a plurality of column buses connected to a cathode of each of the plurality of diodes;

a plurality of row switching elements connected to the plurality of row buses and allowing or blocking power transmission through the plurality of row buses; and a plurality of column switching elements connected to the plurality of column buses and allowing or blocking power transmission through the plurality of column buses, and the second electrode of each of the plurality of heaters is connected to an anode of one of the plurality of diodes.

6. The method of claim 5, wherein a value of each of the components of the transformation matrix are the same as the number of defective diodes connected to a column bus to which a diode corresponding to each of the components of the transformation matrix among the plurality of diodes is connected among the plurality of column buses.

7. The method of claim 6, wherein each of the components of the measurement matrix is determined based on a sum of measured values of currents output through the plurality of column buses after any one of the plurality of row switching elements is turned on and any one of the plurality of column switching elements is turned off.

8. The method of claim 6, wherein each of the components of the measurement matrix is determined based on a sum of measured values of currents output through the plurality of column buses after only one of the plurality of row switching elements is turned on and only one of the plurality of column switching elements is turned off.

9. The method of claim 6, wherein each of the components of the measurement matrix is determined based on a sum of measured values of currents input through the plurality of row buses after only one of the plurality of row switching elements is turned on and only one of the plurality of column switching elements is turned off.

10. The method of claim 1, wherein each of components of the auxiliary matrix is the same as a greatest value among values of components included in a same column of the transformation matrix.

11. A method of inspecting a temperature controlling system including a plurality of row buses, a plurality of row switching elements respectively connected to the plurality of row buses, a plurality of column buses, a plurality of column switching elements respectively connected to the plurality of column buses, a plurality of heaters connected to the plurality of row buses, and a plurality of diodes respectively connected to the plurality of heaters and respectively connected to the plurality of column buses, the method comprising:

determining a measurement matrix by detecting currents output through the plurality of column buses after one row switching element selected from among the plurality of row switching elements is turned on and one column switching element selected from among the plurality of column switching elements is turned off;

calculating a transformation matrix based on the measurement matrix;

calculating an auxiliary matrix based on the transformation matrix; and calculating a defect matrix representing defective diodes among the plurality of diodes based on the auxiliary matrix and the transformation matrix, wherein the transformation matrix is determined according to an equation below, $$Tij = \alpha * \frac{Kij}{1 - Kij}$$

where Tij is a (i,j) component of the transformation matrix, Kij is a (i,j) component of the measurement matrix, and $\alpha$ is determined based on a number of the plurality of column buses and a number of the plurality of row buses.

12. The method of claim 11, wherein $\alpha$ is determined according to an equation below $$\alpha = \frac{N}{N-1}$$

where N is a number of the plurality of column buses and the plurality of row buses.

13. The method of claim 11, wherein the defect matrix is calculated based on a difference operation between the auxiliary matrix and the transformation matrix.

14. The method of claim 11, further comprising determining a plurality of diodes corresponding to components with a value of 0 in the defect matrix as the defective diodes.

15. The method of claim 11, further comprising determining a plurality of diodes corresponding to components with a value other than 0 in the defect matrix as normal diodes.

16. The method of claim 11, wherein determining a plurality of diodes corresponding to components with a value greater than or equal to a threshold in the defect matrix as the defective diodes, and determining a plurality of diodes corresponding to components with a value less than the threshold in the defect matrix as normal diodes.

17. A method of inspecting a temperature controlling system including a plurality of row buses, a plurality of row switching elements respectively connected to the plurality of row buses, a plurality of column buses, a plurality of column switching elements respectively connected to the plurality of column buses, a plurality of heaters connected to the plurality of row buses, and a plurality of diodes respectively connected to the plurality of heaters and respectively connected to the plurality of column buses, the method comprising:

calculating each of components of a transformation matrix which is the same as the number of defective diodes connected to a column bus to which a diode corresponding to each of the components of the transformation matrix among the plurality of diodes is connected among the plurality of column buses;

calculating an auxiliary matrix based on the transformation matrix; and calculating a defect matrix representing defective diodes among the plurality of diodes, based on an operation between the auxiliary matrix and the transformation matrix, wherein each of components of the auxiliary matrix is the same as a greatest value among values of the components included in the same column of the transformation matrix.

18. The method of claim 17, wherein the defect matrix is calculated based on a difference operation between the auxiliary matrix and the measurement matrix.

19. The method of claim 17, further comprising determining a plurality of diodes corresponding to components with a value of 1 among components of the defect matrix as the defective diodes, and determining a plurality of diodes corresponding to components with a value of 0 among components of the defect matrix as normal diodes.

20. The method of claim 17, further comprising determining a plurality of diodes corresponding to components with a value less than a threshold among components of the defect matrix as normal diodes, and determining a plurality of diodes corresponding to components with a value greater than or equal to the threshold among the components of the defect matrix as the defective diodes.

* * * * *